(12) United States Patent
Benaben et al.

(10) Patent No.: US 12,491,572 B2
(45) Date of Patent: Dec. 9, 2025

(54) HEATING DEVICE

(71) Applicants: Continental Automotive France, Toulouse (FR); Continental Automotive GmbH, Hannover (DE)

(72) Inventors: Cédric Benaben, Toulouse (FR); Stéphane Vitali, Toulouse (FR)

(73) Assignee: SCHAEFFLER TECHNOLOGIES AG & CO. KG, Herzogenaurach (DE)

( * ) Notice: Subject to any disclaimer, the term of this patent is extended or adjusted under 35 U.S.C. 154(b) by 988 days.

(21) Appl. No.: 16/489,749

(22) PCT Filed: May 25, 2018

(86) PCT No.: PCT/FR2018/051236
§ 371 (c)(1),
(2) Date: Aug. 29, 2019

(87) PCT Pub. No.: WO2018/220320
PCT Pub. Date: Dec. 6, 2018

(65) Prior Publication Data
US 2020/0061730 A1 Feb. 27, 2020

(30) Foreign Application Priority Data
May 30, 2017 (FR) ........................... 1754757

(51) Int. Cl.
*B23K 1/018* (2006.01)
*B23K 3/047* (2006.01)
(Continued)

(52) U.S. Cl.
CPC ............. *B23K 1/018* (2013.01); *B23K 3/047* (2013.01); *H01L 24/98* (2013.01); *H05K 13/0486* (2013.01); *B23K 2101/42* (2018.08)

(58) Field of Classification Search
CPC ...... B23K 1/018; B23K 2101/42; B23K 3/03; B23K 3/047; H01L 24/98; H05K 13/0486
See application file for complete search history.

(56) References Cited

U.S. PATENT DOCUMENTS 3,526,750 A * 9/1970 Siegel ................. B23K 3/0315
83/171
3,557,430 A 1/1971 Jones
(Continued)

FOREIGN PATENT DOCUMENTS

CN 201205630 Y 3/2009
CN 101439432 A 5/2009
(Continued)

OTHER PUBLICATIONS

Chinese Office Action for Chinese Application No. 201880035832.3, issued Jan. 28, 2021, with translation, 19 pages.
(Continued)

*Primary Examiner* — Minh N Trinh
(74) *Attorney, Agent, or Firm* — Buchanan Ingersoll & Rooney PC

(57) ABSTRACT

A heating device suitable for heating at least one soldered joint between an electronic component including at least a first contact mound and a printed circuit board. The soldered joint on the one hand securing the electronic component to the printed circuit board and on the other hand, while providing electrical continuity, the electronic component also having an electronic-component width, and an electronic-component thickness, wherein it includes an electrical-connection suitable for being coupled to an electrical power supply and a heater suitable for reaching a temperature at least equal to the melting point of the solder.

13 Claims, 4 Drawing Sheets

(51) Int. Cl.
      B23K 101/42   (2006.01)
      H01L 23/00    (2006.01)
      H05K 13/04    (2006.01)

(56)           References Cited

U.S. PATENT DOCUMENTS

| | | | | |
|---|---|---|---|---|
| 3,786,228 | A | * | 1/1974 | Castellana ............ B23K 3/0471 |
| | | | | 428/595 |
| 3,813,023 | A | * | 5/1974 | Auray ................. H05K 13/0491 |
| | | | | 228/19 |
| 4,159,074 | A | | 6/1979 | Basseches |
| 4,187,972 | A | | 2/1980 | Vella |
| 4,637,542 | A | | 1/1987 | Breske et al. |
| 4,659,004 | A | | 4/1987 | Fridman |
| 4,918,277 | A | * | 4/1990 | Zimmer ................ H05K 3/3405 |
| | | | | 228/180.21 |
| 5,058,796 | A | * | 10/1991 | Schwarzbauer ........ H01L 24/75 |
| | | | | 228/5.5 |
| 5,241,156 | A | * | 8/1993 | Wallgren ................ B23K 3/047 |
| | | | | 228/264 |
| 5,565,119 | A | * | 10/1996 | Behun ................... B29C 65/245 |
| | | | | 228/1.1 |
| 5,650,081 | A | * | 7/1997 | Hudson ................ B23K 20/025 |
| | | | | 219/229 |
| 5,909,838 | A | * | 6/1999 | Jimarez ................. B23K 1/018 |
| | | | | 228/264 |
| 6,062,460 | A | * | 5/2000 | Sato .................... H01L 21/4853 |
| | | | | 228/19 |
| 6,629,631 | B2 | * | 10/2003 | Murtishaw ............. B23K 3/033 |
| | | | | 228/103 |
| 6,732,907 | B2 | | 5/2004 | Miyazawa |
| 7,469,457 | B2 | | 12/2008 | Ishikawa et al. |
| 2002/0162880 | A1 | | 11/2002 | Jackson et al. |
| 2003/0019918 | A1 | | 1/2003 | Farooq et al. |
| 2020/0061730 | A1 | * | 2/2020 | Benaben ................ B23K 1/018 |
| 2022/0347779 | A1 | | 11/2022 | Benaben et al. |

FOREIGN PATENT DOCUMENTS

| | | |
|---|---|---|
| DE | 9405654 U1 | 6/1994 |
| EP | 0851722 A1 | 7/1998 |
| FR | 2407045 A1 | 5/1979 |
| FR | 2421029 A1 | 10/1979 |
| JP | 582548 A | 1/1983 |
| JP | 6074843 A | 4/1985 |
| JP | 61162361 A | 7/1986 |
| JP | 62122378 A | 6/1987 |
| JP | 6319967 A | 1/1988 |
| JP | 2008-193083 A | 8/2008 |
| JP | 2015166096 A * | 9/2015 |

OTHER PUBLICATIONS

International Search Report and Written Opinion for International Application No. PCT/FR2018/051236, dated Sep. 21, 2018—9 pages.
Final Office Action for U.S. Appl. No. 17/864,760, mailed Jul. 25, 2023, 24 pages.
Final Office Action for U.S. Appl. No. 17/864,760, mailed Dec. 4, 2023, 11 pages.
Office Action issued by the U.S. Patent and Trademark Office in the U.S. Appl. No. 17/864,760, mailed Mar. 20, 2024, U.S. Patent and Trademark Office, Alexandria, VA. (9 pages).
Office Action issued by the U.S. Patent and Trademark Office in the U.S. Appl. No. 17/864,760, mailed Jul. 30, 2024, U.S. Patent and Trademark Office, Alexandria, VA. (13 pages).
Office Action issued by the U.S. Patent and Trademark Office in the U.S. Appl. No. 17/864,760, mailed Dec. 11, 2024, U.S. Patent and Trademark Office, Alexandria, VA. (11 pages).
Office Action issued by the U.S. Patent and Trademark Office in the U.S. Appl. No. 17/864,760, mailed May 19, 2025, U.S. Patent and Trademark Office, Alexandria, VA. (6 pages).

* cited by examiner

HEATING DEVICE

CROSS REFERENCE TO RELATED APPLICATIONS

This application is the U.S. National Phase Application of PCT International Application No. PCT/FR2018/051236, filed May 25, 2018, which claims priority to French Patent Application No. 1754757, filed May 30, 2017, the contents of such applications being incorporated by reference herein.

FIELD OF THE INVENTION

The present invention relates in general to a heating device for desoldering an electronic component from a printed circuit board.

The invention is applicable in particular in the field of electronics.

BACKGROUND OF THE INVENTION

An electronic device such as an electronic engine control computer arranged in a motor vehicle experiences numerous stresses. These stresses may be of a mechanical, thermal, electrical nature and may sometimes cause permanent or intermittent failures of said electronic engine control computer.

These engine control computer failures or faults require the intervention of a skilled individual to diagnose them. In order to perform this analysis of the failure of said electronic engine control computer, it is often necessary to remove same from said motor vehicle so that the origin of the fault can be inspected.

The high density at which electronic components are integrated mean that certain complex electronic components, such as a microcontroller for example, need to be removed in order to analyze the origin of the fault. In order to do this, it is known practice to locally heat the electronic component that is to be desoldered, as well as the printed-circuit board, using a bell so as to melt the metal alloy of the soldered joint(s). Before performing this step, it is necessary to place the electronic board that is to be tested in an oven, something which can sometimes make an observed fault associated, for example with an ingress of moisture into the printed-circuit board and/or into the electronic component, disappear.

SUMMARY OF THE INVENTION

An aspect of the invention proposes a heating device that provides a partial or full solution to the technical shortcomings of the cited prior art.

To this end, a first aspect of the invention proposes a heating device suitable for heating at least one soldered joint between an electronic component comprising at least a first contact mound and a printed circuit board, the soldered joint on the one hand securing the electronic component to the printed circuit board and on the other hand providing electrical continuity, the electronic component also having an electronic-component width, and an electronic-component thickness, characterized in that it comprises electrical-connection means suitable for being coupled to an electrical power supply and heating means suitable for reaching a temperature at least equal to the melting point of the material of which the solder is made.

For example, the heating means have a cylindrical shape.

As an alternative, the heating means have a parallelepipedal shape.

In order to improve the effectiveness of the heating device, it is proposed for example that the heating means have a heating-means thickness smaller than a space separating the electronic component from the printed circuit board.

In order to make the heating device easier to manipulate, the heating means have for example a heating-means length that is greater than the width of the electronic component.

In order to desolder the electronic component from the printed circuit it is for example proposed that the heating means be suitable for reaching a temperature at least equal to the melting point of the material of which the solder is made.

A second aspect of the invention proposes a method for heating at least one soldered joint between an electronic component and a printed circuit board, comprising the following steps:
 coupling the heating device to an electrical power supply,
 placing the heating device between the electronic component and the printed circuit board at a space separating said electronic component from the printed circuit board,
 activating the electrical power supply, and
 moving the heating means under the electronic component against the solder at a determined speed when the temperature of the heating means reaches a melting point of the solder.

BRIEF DESCRIPTION OF THE DRAWINGS

Other features and advantages of aspect of the invention will become more apparent upon reading the description that will follow. This description is purely illustrative and should be read with reference to the appended drawings, in which.

DETAILED DESCRIPTION OF THE PREFERRED EMBODIMENTS

Figure 1:
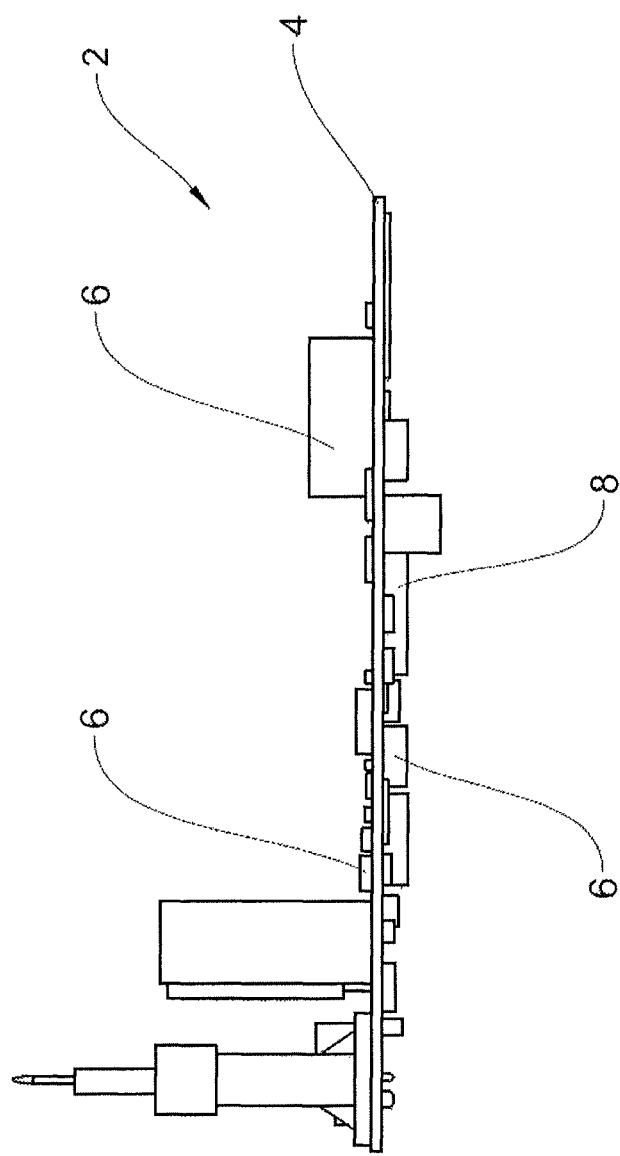
FIG. 1 is a simplified diagram of an electronic board.

FIG. 1 depicts a schematic view of an electronic board 2 which may be that of an electronic engine control computer arranged in a motor vehicle. The electronic board 2 comprises a printed circuit board 4, also referred to as a PCB, on which electronic components 6 are arranged. The printed circuit board 4 may be a single-layer or multi-layer printed circuit board depending on the complexity of the electronic board 2. The electronic components 6 may be of various forms and have a variable number of pins.

In the example which follows and to illustrate an aspect of the invention, a complex electronic component 8 is also soldered to the printed circuit board 4. The complex electronic component 8 is, for example, a microcontroller. For preference, the complex electronic component 8 is provided with a Ball Grid Array, or BGA package. Furthermore, one of the advantages of such a component equipped with a BGA package is its compactness which allows it to have a relatively high density of contact mounds, corresponding to a distance between the balls of solder. For example, the distance between the balls of solder is of the order of 100 µm (1 µm=1·10$^{-6}$ m).

Figure 2:
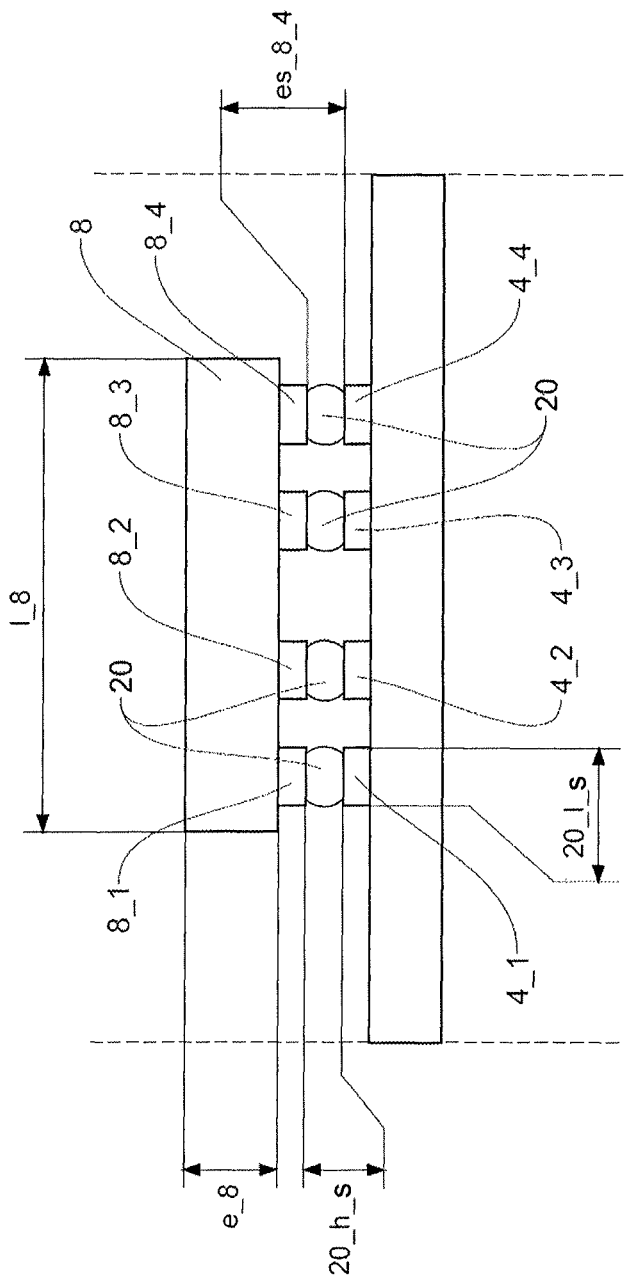
FIG. 2 is a view in cross section of the electronic board of FIG. 1.

FIG. 2 schematically depicts a view in cross section of the complex electronic component 8 soldered to the printed circuit board 4. The complex electronic component 8 therefore has a ball grid made up in this example of a first contact mound 8_1, of a second contact mound 8_2, of a third contact mound 8_3 and of a fourth contact mound 8_4. The number of contact mounds and the layout of the contact mounds are given by way of example. Furthermore, the complex electronic component 8 has a complex electronic component thickness e_8 and a complex electronic component width l_8.

The printed circuit board 4 comprises a first socket 4_1, a second socket 4_2, a third socket 4_3 and finally a fourth socket 4_4. In one exemplary embodiment, the sockets 4_1 to 4_4 have the same shape as that of the contact mounds 8_1 to 8_4. Furthermore, the sockets 4_1 to 4_4 on the one hand have the same spacing as the spacing of the contact mounds 8_1 to 8_4, and on the other hand have the same layout as that of the contact mounds 8_1 to 8_4.

In order to achieve contact and electrical continuity between the complex electronic component 8 and the printed circuit board 4, soldered joints 20 are made using a metal alloy. Soldering of the "wave" type well known to those skilled in the art is performed for example.

As mentioned earlier in the text of the description, it is sometimes possible for faults to occur in an electronic component 6 of the electronic engine control computer. In our case for example, it will be the complex electronic component 8 which will exhibit a fault. This fault may, for example, be 20 a fault on an analog input that will entail unmounting the complex electronic component 8.

In the example of FIG. 2 and the subsequent figures, in order to illustrate an aspect of the invention and the associated method, it has been chosen that the second socket 4_2 of the printed circuit board 4 is defective. In order to identify this fault and locate it, it is necessary to desolder the complex electronic component 8 from the printed circuit board 4 in order to determine whether the fault stems from the printed circuit board 4 or from the complex electronic circuit 8.

In order to do that, an aspect of the present invention proposes a heating device 10 suitable for heating the soldered joints and desoldering the complex electronic component 8 from said printed circuit board 4 without heating said printed circuit board 4 and without the use of a bell.

Figure 3:
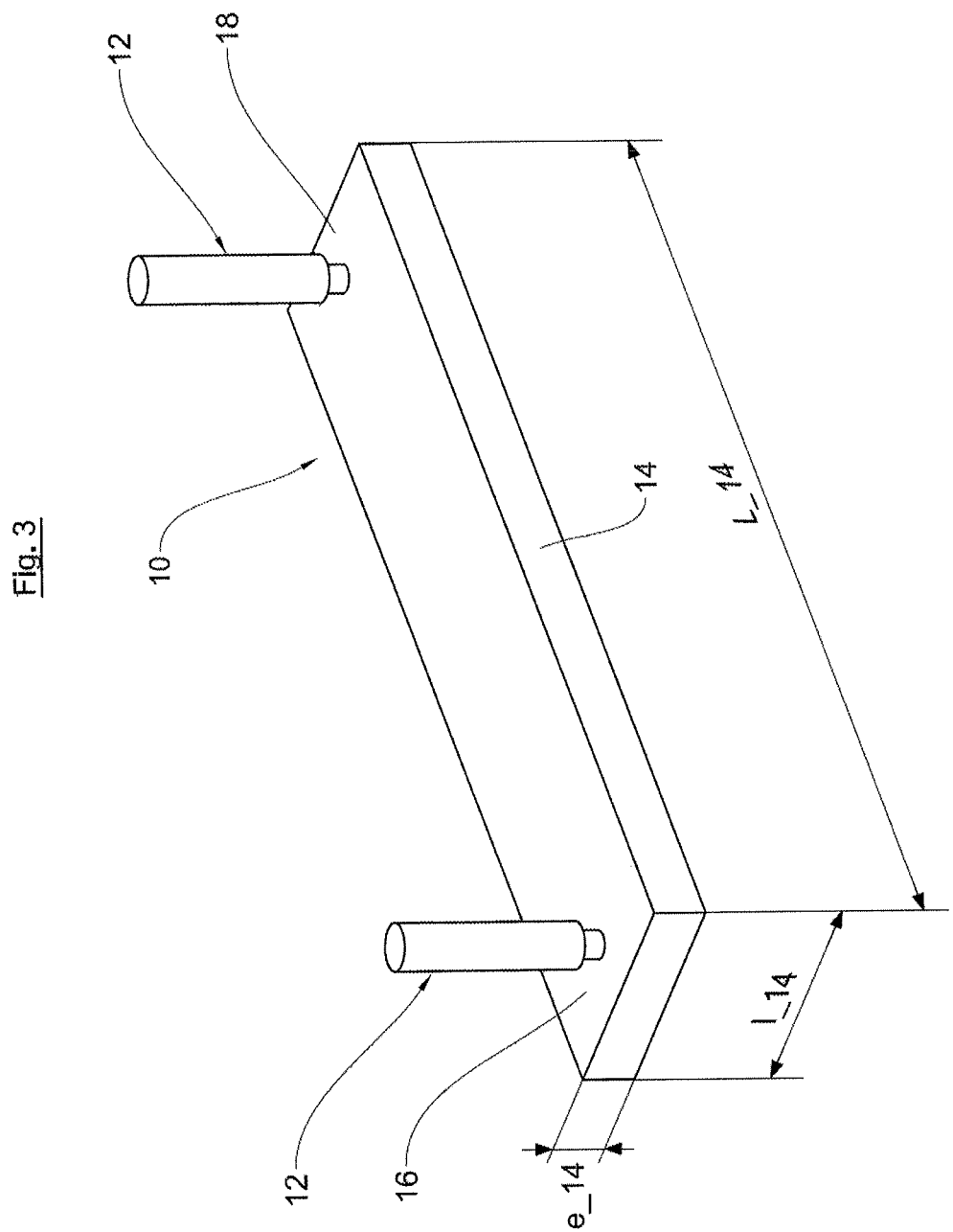
FIG. 3 is a schematic diagram of the device of an aspect of the invention.

As illustrated in FIG. 3, the heating device 10 comprises electrical-connection means 12 and heating means 14. The heating means 14 adopt, for example, a parallelepipedal shape like a blade. The heating means 14 have a heating-means length L_14, a heating-means width l_14 and a heating-means thickness e_14.

Advantageously, to make it easier for the heating means 14 to pass under the complex electronic component 8, it is proposed that the heating-means length L_14 have a value that is slightly greater than the value of the width e_8 of the complex electronic component. Thus, for example, the heating-means length L_14 is equal to 1.5 cm, for a complex electronic component width e_8 equal to 1.3 cm.

Furthermore, in order to allow heating means 14 to pass underneath and between the complex electronic component 8 and the printed circuit board 4, the heating-means thickness e_14 is less than a space es_8_4 separating the complex electronic component 8 from the printed circuit board 4. This space es_8_4 is equal and imposed by a height of solder 20_h_s. For example, in instances in which the value of the height of solder 20_h_s is equal to 100 µm, the heating-means thickness e_14 adopts a value of 80 µm.

Also, in order to improve the effectiveness of the heating device 10, it is proposed that the heating means 14 and, more particularly, the heating-means width l_14 have a value greater than a solder width 20_l_s.

The heating device 10 also has a heating-means first end 16 and a heating-means second end 18. The heating-means first end 16 and the heating-means second end 18 are arranged one on each side of the heating means 14. In the exemplary embodiment illustrated here, they are arranged one on each side of the blade.

These two ends 16 and 18 are suited to receiving and/or being coupled to the electrical-connection means 12. The electrical-connection means 12 are, for example, two electric wires coupled to a stabilized electrical power supply.

Figure 4:
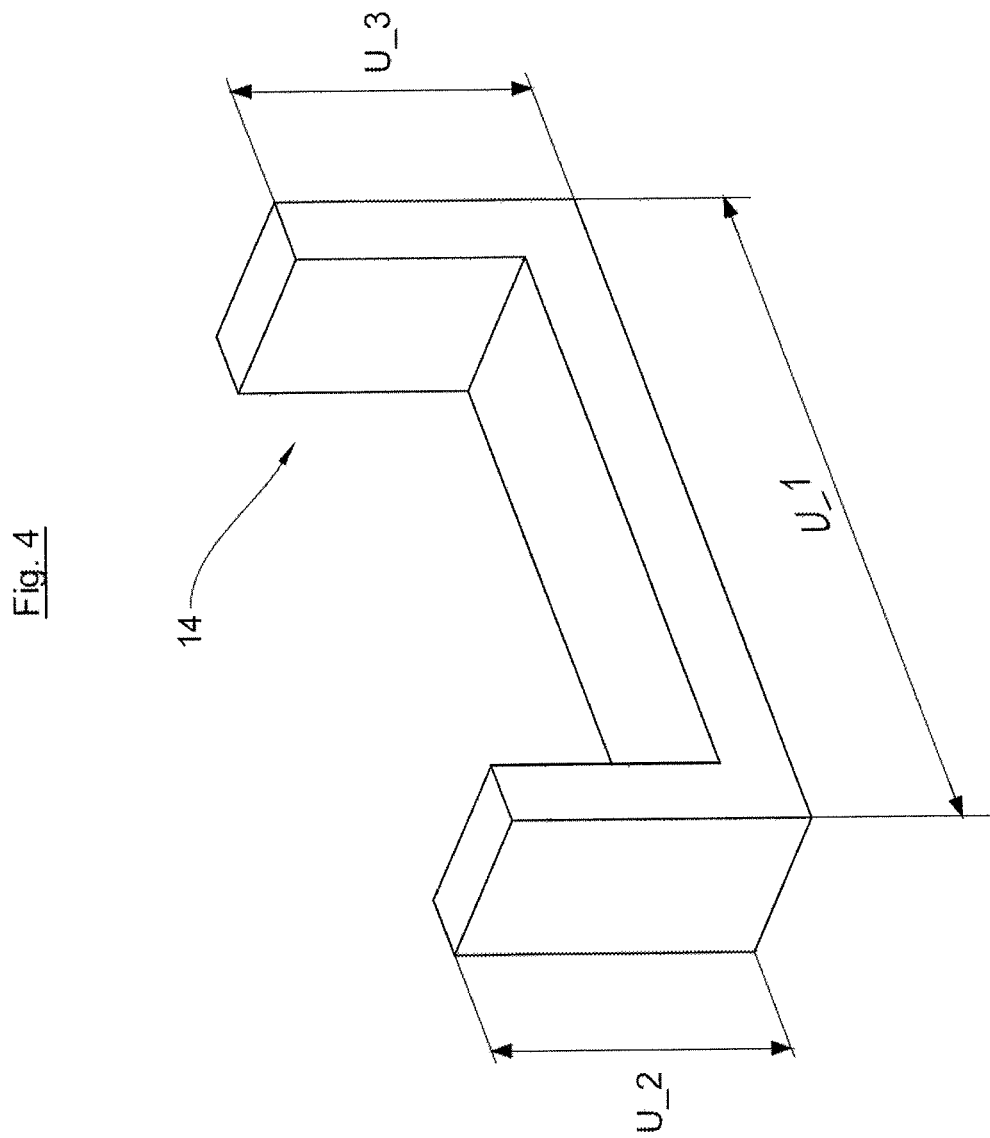
FIG. 4 is a schematic diagram of the device of an aspect of the invention according to another embodiment.

In another exemplary embodiment of an aspect of the invention and as illustrated in FIG. 4, the heating means 14 are U-shaped. For example, a first part of the U, referred to as U_1, has a length at least equal to the width of the complex electrical component l_8. Furthermore, the two arms of the U, referred to as U_2 and U_3 have a same dimension at least equal to, but preferably greater than, the complex electronic component thickness e_8. In another exemplary embodiment, the two arms of the U, referred to as U_2 and U_3 have a height at least equal to the sum of the complex electronic component thickness e_8 and the height of solder 20_h_s.

In another exemplary embodiment illustrated in FIG. 5, the heating means 14 have a cylindrical shape in which a diameter of the cylinder is less than the height of solder h_s.

The heating device 10 is, for example, made of metal or of metal alloy.

An aspect of the invention also proposes a heating method making it possible to heat at least one soldered joint of a ball grid array of an electronic component 6 and more particularly of a complex electronic component 8. In the remainder of the description, it will be considered that the electronic board 2 is outside the housing of the electronic engine control computer. Furthermore, it will be considered that a possible fault has been observed and located to an area in which the complex electronic component 8 is present.

The method of an aspect of the invention proposes first of all in a first step e1 coupling the electrical connection means 12 to an electrical power supply. In one exemplary embodiment, the electrical power supply is a stabilized supply.

During a second step e2, the heating device 10 is brought closer to the complex electronic component 8 that is to be desoldered. For preference, the heating means 14 are positioned at the space es_8_4 separating the complex electronic component 8 from the printed circuit board 4. Furthermore, the heating means 14 are positioned against the soldered joint(s) 20.

During a third step e3, the electrical power supply is activated. This power supply is suitable for generating sufficient voltage that the heating means 14 reach a temperature at least equal to a melting point of the metal alloy of which the soldered joints are made. In one exemplary embodiment, the temperature is 250° C.

During a fourth step e4, the heating device 10 is moved around so that it passes between the complex electronic component 8 and the printed circuit board 4. Advantageously, the speed at which the heating device 10 moves is connected to the rate at which the metal alloy of the soldered joints 20 melts on contact with the heating means 14. In one exemplary embodiment, the heating device is moved across the entire width of the complex electronic component 8, something which advantageously allows it to be desoldered from the printed circuit board 4.

An aspect of the present invention thus allows the soldered joint(s) attaching an electronic component to a printed circuit board to be heated without the use of a bell. Thus, advantageously, only the electronic component that is to be desoldered experiences a rise in temperature, thereby improving the reliability with which a fault is detected. Thus it is possible to desolder and remove the electronic component from the printed circuit board without excessively heating the nearby components.

Of course, aspects of the present invention are not limited to the preferred embodiment described above and illustrated in the drawing and to the variant embodiments mentioned, but extends to all variants within the competence of those skilled in the art.

The invention claimed is:

1. A heating device comprising:
a heating means comprising a body having a top surface, a bottom surface, and two side surfaces, the top surface and the bottom surface being contiguous surfaces configured to be arranged between an electronic component and a printed circuit board, the heating means being configured to reach a temperature at least equal to a melting point of a solder; and
electrical-connection means arranged on at least one of the top surface, the bottom surface, or the two side surfaces, the electrical-connection means being configured to be coupled to an electrical power supply,
wherein the heating device is configured to heat at least one soldered joint between the electronic component and the printed circuit board.

2. The heating device as claimed in claim 1, wherein the heating means have a cylindrical shape.

3. The heating device as claimed in claim 1, wherein the heating means have a parallelepipedal shape.

4. The heating device as claimed in claim 1, wherein the heating means have a heating-means thickness smaller than a space separating the electronic component from the printed circuit board.

5. The heating device as claimed in claim 1, wherein the heating means have a heating-means length greater than a width of the electronic component.

6. The heating device as claimed in claim 1, wherein the heating means is configured to reach a temperature at least equal to a melting point of the material of which the solder is made.

7. The heating device as claimed in claim 1, wherein the soldered joint secures the electronic component to the printed circuit board and provides electrical continuity, the electronic component also having an electronic-component width, and an electronic-component thickness.

8. The heating device as claimed in claim 1, wherein the heating means have a U-shape.

9. The heating device as claimed in claim 8, wherein a first part of the U-shape has a length that is equal to a width of the electronic component and two arms each having a height that is greater than the width of the electronic component.

10. The heating device as claimed in claim 8, wherein a first part of the U-shape has a length that is equal to a width of the electronic component and two arms each having a height that is equal to a sum of a thickness of the electronic component and a height of the solder.

11. The heating device as claimed in claim 1, wherein the heating means have a heating-means width greater than a width of the solder.

12. The heating device as claimed in claim 1, wherein the heating means have a shape of a blade.

13. The heating device as claimed in claim 1, wherein the heating means have a heating-means thickness of 80 µm.

* * * * *